United States Patent
Anderson (10) Patent No.: US 9,722,632 B2
(45) Date of Patent: Aug. 1, 2017

(54) SLIDING WINDOW LIST DECODER FOR ERROR CORRECTING CODES

(71) Applicant: Streamscale, Inc., Los Angeles, CA (US)

(72) Inventor: Michael H. Anderson, Los Angeles, CA (US)

(73) Assignee: STREAMSCALE, INC., Los Angeles, CA (US)

( * ) Notice: Subject to any disclaimer, the term of this patent is extended or adjusted under 35 U.S.C. 154(b) by 344 days.

(21) Appl. No.: 14/492,685

(22) Filed: Sep. 22, 2014

(65) Prior Publication Data

US 2016/0087654 A1    Mar. 24, 2016

(51) Int. Cl.
*H03M 13/09* (2006.01)
*H03M 13/15* (2006.01)
*H03M 13/00* (2006.01)

(52) U.S. Cl.
CPC ....... *H03M 13/091* (2013.01); *H03M 13/158* (2013.01); *H03M 13/1515* (2013.01); *H03M 13/1575* (2013.01); *H03M 13/1595* (2013.01); *H03M 13/6561* (2013.01)

(58) Field of Classification Search
CPC ............ G06F 11/1092; G06F 11/1096; H03M 13/091
See application file for complete search history.

(56) References Cited

U.S. PATENT DOCUMENTS

| 5,577,054 | A | * | 11/1996 | Pharris | H04L 1/0057 |
| | | | | | 386/268 |
| 5,754,563 | A | * | 5/1998 | White | H03M 13/151 |
| | | | | | 708/492 |
| 6,486,803 | B1 | * | 11/2002 | Luby | H04L 1/0083 |
| | | | | | 341/50 |
| 6,654,924 | B1 | | 11/2003 | Hassner et al. | |
| 6,823,425 | B2 | | 11/2004 | Ghosh et al. | |
| 7,350,126 | B2 | | 3/2008 | Winograd et al. | |

(Continued)

OTHER PUBLICATIONS

Neifeld, M. A., & Sridharan, S. K. (1997). Parallel error correction using spectral Reed-Solomon codes. Journal of Optical Communications, 18(4), 144-150.*

(Continued)

*Primary Examiner* — Steve Nguyen
(74) *Attorney, Agent, or Firm* — Lewis Roca Rothgerber Christie LLP (57) ABSTRACT

A system for hardware error-correcting code (ECC) detection or correction of a received codeword from an original codeword includes an error-detecting circuit configured to process a selection of symbols of the received codeword using a set of factors, the original codeword being recomputable from a corresponding said selection of symbols of the original codeword using the set of factors. The error-detecting circuit includes a hardware multiplier and accumulator configured to use the set of factors and the selection of symbols of the received codeword to recompute remaining symbols of the original codeword, and a hardware comparator configured to compare the recomputed remaining symbols of the original codeword with corresponding said remaining symbols of the received codeword and to output first results of this comparison.

7 Claims, 7 Drawing Sheets

(56) References Cited

U.S. PATENT DOCUMENTS

| | | | |
|---|---|---|---|
| 7,865,809 B1* | 1/2011 | Lee | G06F 11/1068 |
| | | | 714/781 |
| 7,930,337 B2 | 4/2011 | Hasenplaugh et al. | |
| 8,145,941 B2* | 3/2012 | Jacobson | G06F 11/1076 |
| | | | 714/6.24 |
| 8,352,847 B2 | 1/2013 | Gunnam | |
| 8,560,932 B2* | 10/2013 | Kleihorst | G01R 31/31921 |
| | | | 714/736 |
| 8,914,706 B2 | 12/2014 | Anderson | |
| 2009/0055717 A1* | 2/2009 | Au | H03M 13/1515 |
| | | | 714/784 |
| 2009/0249170 A1* | 10/2009 | Maiuzzo | H03M 13/154 |
| | | | 714/780 |
| 2010/0293439 A1* | 11/2010 | Flynn | G06F 11/073 |
| | | | 714/763 |
| 2011/0029756 A1 | 2/2011 | Biscondi et al. | |
| 2012/0272036 A1 | 10/2012 | Muralimanohar et al. | |
| 2013/0108048 A1 | 5/2013 | Grube et al. | |
| 2013/0110962 A1 | 5/2013 | Grube et al. | |
| 2013/0111552 A1 | 5/2013 | Grube et al. | |
| 2013/0124932 A1 | 5/2013 | Schuh et al. | |
| 2013/0173956 A1* | 7/2013 | Anderson | G06F 11/1076 |
| | | | 714/6.24 |
| 2014/0040708 A1* | 2/2014 | Maiuzzo | H03M 13/2936 |
| | | | 714/784 |
| 2014/0068391 A1* | 3/2014 | Goel | H03M 13/152 |
| | | | 714/785 |

OTHER PUBLICATIONS

M. Lalam, K. Amis and D. Leroux, "Sliding Encoding-Window for Reed-Solomon code decoding," 4th International Symposium on Turbo Codes & Related Topics; 6th International ITG-Conference on Source and Channel Coding, Munich, Germany, 2006, pp. 1-6.*
Anvin, "The mathematics of RAID-6", First Version Jan. 20, 2004; Last Updated Dec. 20, 2011; pp. 1-9.
Hafner et al., "Matrix Methods for Lost Data Reconstruction in Erasure Codes", Nov. 16, 2005, USENIX Fast '05 Paper, pp. 1-26.
Lee, "High-Speed VLSI Architecture for Parallel Reed-Solomon Decoder", IEEE Transactions on Very Large Scale Integration (VLSI) Systems, vol. 11, No. 2, Apr. 2003, pp. 288-294.
Li et al., "Preventing Silent Data Corruptions from Propagating During Data Reconstruction", IEEE Transactions on Computers, vol. 59, No. 12, Dec. 2010, 14 sheets.
Maddock, et al., "White Paper, Surviving Two Disk Failures Introducing Various "RAID 6" Implementations", Xyratex, 2005, pp. 1-13.
Mann, "The Original View of Reed-Solomon Coding and the Welch-Berlekamp Decoding Algorithm", A Dissertation Submitted to the Faculty of the Graduate Interdisciplinary Program in Applied Mathematics, The University of Arizona, Jul. 19, 2013, 143 sheets.
Plank, "All About Erasure Codes:—Reed-Solomon Coding—LDPC Coding", Logistical Computing and Internetworking Laboratory, Department of Computer Science, University of Tennessee; ICL—Aug. 20, 2004, 52 sheets.
Casey Henderson: Letter to the USENIX Community <https://www.usenix.org/system/files/conference/fast13/fast13_memo_021715.pdf> Feb. 17, 2015.
Chandan Kumar Singh: EC Jerasure plugin and StreamScale Inc, <http://www.spinics.net/lists/ceph-devel/msg29944.html> Apr. 20, 2016.
Code Poetry and Text Adventures: <http://catid.mechafetus.com/news/news.php?view=381> Dec. 14, 2014.
Curtis Chan: StreamScale Announces Settlement of Erasure Code Technology Patent Litigation, <http://www.prweb.com/releases/2014/12/prweb12368357.htm>, Dec. 3, 2014.

Ethan Miller, <https://plus.google.com/113956021908222328905/posts/bPcYevPkJWd>, Aug. 2, 2013.
James S. Plank, Ethan L. Miller, Will B. Houston: GF-Complete: A Comprehensive Open Source Library for Galois Field Arithmetic, <http://web.eecs.utk.edu/~plank/plank/papers/CS-13-703.html> Jan. 2013.
James S. Plank, Jianqiang Luo, Catherine D. Schuman, Lihao Xu, Zooko Wlcox-O'Hearn: A Performance Evaluation and Examination of Open-Source Erasure Coding Libraries for Storage, <https://www.usenix.org/leqacy/event/fast09/tech/full_papers/plank/plank_html/> 2009.
Kevin M. Greenan, Ethan L. Miller, Thomas J.E. Schwarz, S. J.: Optimizing Galois Field Arithmetic for Diverse Processor Architectures and Applications, *Proceedings of the 16th IEEE International Symposium on Modeling, Analysis, and Simulation of Computer and Telecommunication Systems (MASCOTS 2008)*, Baltimore, MD, Sep. 2008.
Li Han and Qian Huan-yan. "Parallelized Network Coding with SIMD instruction sets." In *Computer Science and Computational Technology, 2008. ISCSCT'08. International Symposium on*, vol. 1, pp. 364-369. IEEE, 2008.
Loic Dachary: Deadline of Github pull request for Hammer release, <http://www.spinics.net/lists/ceph-devel/msg22001.html> Jan. 13, 2015.
Louis Lavile: <https://twitter.com/louislavile> Nov. 13, 2014.
Marius Gedminas: <http://eavesdrop.openstack.org/irclogs/%23openstack-swift/%23openstack-swift.2015-04-30.log.html> Apr. 29, 2015.
Matthew L. Curry, Anthony Skjellum, H. Lee Ward, and Ron Brightwell. "Arbitrary dimension reed-solomon coding and decoding for extended raid on gpus." In *Petascale Data Storage Workshop, 2008. PDSW'08. 3rd*, pp. 1-3. IEEE, 2008.
Matthew L. Curry, Anthony Skjellum, H. Lee Ward, Ron Brightwell: Gibraltar: A Reed-Solomon coding library for storage applications on programmable graphics processors. *Concurrency and Computation: Practice and Experience* 23(18): pp. 2477-2495 (2011).
Matthew L. Curry, H. Lee Ward, Anthony Skjellum, Ron Brightwell: A Lightweight, GPU-Based Software RAID System. ICPP 2010: pp. 565-572.
Matthew L. Curry, Lee H. Ward, Anthony Skjellum, and Ron B. Brightwell: Accelerating Reed-Solomon Coding in RAID Systems With GPUs, *Parallel and Distributed Processing, 2008. IPDPS 2008. IEEE International Symposium on.* IEEE, 2008.
Michael A. O'Shea: StreamScale, <https://lists.ubuntu.com/archives/technical-board/2015-April/002100.html> Apr. 29, 2015.
Mike Masnik: Patent Troll Kills Open Source Project on Speeding Up the Computation of Erasure Codes, <https://www.techdirt.com/articles/20141115/07113529155/patent-troll-kills-open-source-project-speeding-up-computation-erasure-codes.shtml>, Nov. 19, 2014.
Robert Louis Cloud, Matthew L. Curry, H. Lee Ward, Anthony Skjellum, Purushotham Bangalore: Accelerating Lossless Data Compression with GPUs. CoRR abs/1107.1525 (2011).
Roy Schestowitz: US Patent Reform (on Trolls Only) More or Less Buried or Ineffective, <http://techrights.org/2014/12/12/us-patent-reform/> Dec. 12, 2014.
Weibin Sun, Robert Ricci, Matthew L. Curry: GPUstore: harnessing GPU computing for storage systems in the OS kernel. *SYSTOR 2012*: p. 6.
Xin Zhou, Anthony Skjellum, Matthew L. Curry: Abstract: Extended Abstract for Evaluating Asynchrony in Gibraltar RAID's GPU Reed-Solomon Coding Library. *SC Companion 2012*: pp. 1496-1497.
Xin Zhou, Anthony Skjellum, Matthew L. Curry: Poster: Evaluating Asynchrony in Gibraltar RAID's GPU Reed-Solomon Coding Library. *SC Companion 2012*: p. 1498.

* cited by examiner

SLIDING WINDOW LIST DECODER FOR ERROR CORRECTING CODES

CROSS REFERENCE TO RELATED APPLICATIONS

This application is related to U.S. patent application Ser. No. 13/727,581 (hereinafter "the Reference Application"), entitled "USING PARITY DATA FOR CONCURRENT DATA AUTHENTICATION, CORRECTION, COMPRESSION, AND ENCRYPTION," filed on Dec. 26, 2012, the entire content of which is incorporated herein by reference.

BACKGROUND

1. Field

Aspects of embodiments of the present invention are directed toward a sliding window list decoder for error correcting codes.

2. Description of Related Art

Communication and storage technologies are rapidly evolving. 400 Gbit (gigabit) communication systems are in design, while 100 Tbit (terabit) systems are predicted by 2020. Given this growth, error correction power needs to scale up with transmission speed. As transmission rates increase, burst error lengths increase proportionally. For example, the same single bit error event at 10 Mbit (megabit) can affect 1000 bits at 10 Gbit. Traditional serial error correcting code (ECC) decoders (circa 1960) scale badly, and are guaranteed to silently corrupt data for some large errors. For the most part, they are all based on the same mathematics: derive key equation, solve the equation, then recover the correct data. Their latency increases with the correction power (e.g., number of symbols or entries, where each symbol or entry is some quantity of data, such as a byte), and their likelihood to silently corrupt data increases with error size.

Reed-Solomon error correction and other applications of ECC (such as data verification, encryption, and compression) are described in the Reference Application. Example solutions of Reed-Solomon error correction (such as the Welch-Berlekamp algorithm, or just Berlekamp) are described in Mann, *The Original View of Reed-Solomon Coding and the Welch-Berlekamp Decoding Algorithm*, Ph.D. dissertation, Univ. of Arizona, 2013, the entire content of which is incorporated by reference. Maximum likelihood decoding of Reed-Solomon codes is an NP-hard problem. In particular, there is no known algorithm to choose the most likely decoding for K data symbols and T check (or parity) symbols (i.e., for codewords of N=K+T symbols) having up to T−1 errors by any algorithm in polynomial time with respect to N.

Put another way, the processing complexity of any such known algorithm grows at least exponentially with N. The majority of existing Reed-Solomon error correction techniques, such as Welch-Berlekamp, are serial in nature, and require multiple clock cycles (the clock cycle count being proportional to N) to perform their correction. For more than T/2 errors, decoders such as Welch-Berlekamp have a design flaw such that cases with more than T/2 errors but fewer than T errors can be mistaken for cases with fewer than T/2, resulting in silent data corruption.

SUMMARY

Aspects of embodiments of the present invention are directed toward a sliding window list decoder for error correcting codes. In particular, aspects are directed toward the use of multiple Parallel Error Correctors (PECs) for significantly speeding up the processing of Reed-Solomon encoded codewords, and eliminating many cases of silent data corruption. Applications include erasure code data verification, correction, encryption, and compression, alone or in combination with each other, as described in the Reference Application.

In an embodiment of the present invention, multiple Reed-Solomon matrix multipliers are implemented in hardware and run concurrently. Each multiplier recomputes some portion of a received codeword. It should be noted that, as used throughout, a "received codeword" (or "supplied codeword") may include the original codeword modified by some error word, which may or may not be 0. As such, a received codeword does not have to be a valid, consistent codeword. Based on the consistency of the regenerated symbols to the received symbols, different actions may be taken. For example, depending on the consistency of the regenerated symbols between multipliers, the multiplier(s) that produces the fewest number of errors may be selected for error correction. In another embodiment, the position of all errors (such as burst errors) smaller than length T may be identified.

In another embodiment, if any one multiplier corrects the fewest number of symbols, and it corrects no more symbols than half the number of parity symbols, then that multiplier is selected for error correction. In yet another embodiment, based on the consistency of the regenerated symbols to other regenerated symbols, the position of all possible errors smaller than length T can be identified.

According to some embodiments of the present invention, parallel ECC or sliding window list decoders are used in place of serial techniques. Parallel ECC and sliding window list decoders scale better than other approaches. For example, they have fixed latency and regular structure, the separate ECC decoders can do all of their processing independently of each other (thus making them readily parallelizable), their correction power scales with space (gate count) rather than time (frequency or gate speed), and they can easily be partitioned and realized as with a multi-core CPU. Parallel ECC and sliding window list decoders achieve faster correction through using more gates, not faster gates, extending the use of Reed Solomon decoders to new applications, such as low latency DRAM or Flash memory systems.

According to some other embodiments of the present invention, sliding window list decoders are used in concert with serial techniques. Many existing techniques such as the Welch-Berlekamp algorithm only correct up to T/2 errors and can sometimes miscorrect more than T/2 errors even when they are caused by burst errors. The sliding window list decoder can provide information that can help other techniques both correct more errors and avoid miscorrections. The sliding window list decoder is able to do this by using more gates and more processing power, as well as exploiting situations where burst errors are more likely than sparse errors, which may happen in many real world situations.

According to an embodiment of the present invention, a system for hardware error-correcting code (ECC) detection or correction of a received codeword from an original codeword is provided. The system includes an error-detecting circuit configured to process a selection of symbols of the received codeword using a set of factors, the original codeword being recomputable from a corresponding said selection of symbols of the original codeword using the set of factors. The error-detecting circuit includes a hardware multiplier and accumulator configured to use the set of factors and the selection of symbols of the received codeword to recompute remaining symbols of the original codeword, and a hardware comparator configured to compare the recomputed remaining symbols of the original codeword with corresponding said remaining symbols of the received codeword and to output first results of this comparison.

The one of the error-detecting circuits may be further configured to output the selection of symbols of the received codeword and the recomputed remaining symbols of the original codeword as an error-corrected codeword based on the first results.

The hardware comparator may be further configured to compare the recomputed remaining symbols of the original codeword with the remaining symbols of the received codeword by counting a first number of the recomputed remaining symbols of the original codeword that equal respective ones of the remaining symbols of the received codeword, and the first results may include the first number.

The error-detecting circuit may be further configured to output the selection of symbols of the received codeword and the recomputed remaining symbols of the original codeword as an error-corrected codeword based on the first number.

The error-detecting circuit may be further configured to output the error-corrected codeword when the first number is at least as large as a first threshold.

The first threshold may be one-half of a number of the remaining symbols of the received codeword.

The error-detecting circuit may be further configured to output an error indicator when the first number is smaller than the first threshold.

The error-detecting circuit may include plurality of error-detecting circuits each configured to process a different said selection of symbols of the received codeword using a different said set of factors.

Each of the error-detecting circuits may be further configured to output the selection of symbols of the received codeword and the recomputed remaining symbols of the original codeword as an error-corrected codeword based on the first results.

The system may further include a multiplexor configured to output the error-corrected codeword from one of the error-detecting circuits based on the first results from all of the error-detecting circuits.

The hardware comparator may be further configured to compare the recomputed remaining symbols of the original codeword with the remaining symbols of the received codeword by counting a first number of the recomputed remaining symbols of the original codeword that equal respective ones of the remaining symbols of the received codeword, and the first results may include the first number.

Each of the error-detecting circuits may be further configured to output the selection of symbols of the received codeword and the recomputed remaining symbols of the original codeword as an error-corrected codeword based on the first number.

The system may further include a multiplexor configured to output the error-corrected codeword from one of the error-detecting circuits when the first number from the one of the error-detecting circuits is a largest said first number from all of the error-detecting circuits.

The multiplexor may be further configured to output the error-corrected codeword from the one of the error-detecting circuits when the largest first number is at least as large as a first threshold.

The first threshold may be one-half of a number of the remaining symbols of the received codeword.

The system may be configured to output an error indicator when the largest first number is smaller than the first threshold.

When more than one of the error-detecting circuits has the largest first number, the system may be configured to output an error indicator when the error-corrected codeword from each of the more than one of the error-detecting circuits having the largest first number are not equal.

According to another embodiment of the present invention, a system for hardware error-correcting code (ECC) detection or correction of a received codeword from an original codeword is provided. The system includes a plurality of error-detecting circuits each configured to process a different selection of symbols of the received codeword using a different set of factors, some or all remaining symbols of the original codeword being recomputable from a corresponding said selection of symbols of the original codeword using the set of factors. Each of the error-detecting circuits includes a hardware multiplier and accumulator configured to use the set of factors and the selection of symbols of the received codeword to recompute the some or all remaining symbols of the original codeword, and a hardware comparator configured to compare one or more of the recomputed remaining symbols of the original codeword with a corresponding said one or more remaining symbols of the received codeword or the recomputed remaining symbols of the original codeword from another one of the error-detecting circuits, and to output first results of this comparison.

Each of the error-detecting circuits may be further configured to output at least one of the recomputed remaining symbols of the original codeword as error-corrected symbols of the received codeword based on the first results.

The first results may include complete equality of the compared recomputed remaining symbols of the original codeword.

The symbols of the received codeword may be ordered, and each of the error-detecting circuits may be further configured to process a different consecutive selection of symbols of the received codeword.

A number of the error-detecting circuits may equal a number of the symbols of the received codeword.

The error-detecting circuits may be ordered by respective first symbols of their corresponding consecutive selections of symbols of the received codeword, and for each of the error-detecting circuits, the other one of the error-detecting circuits may be a consecutive one of the error-detecting circuits.

According to yet another embodiment of the present invention, a method of hardware error-correcting code (ECC) detection or correction of a received codeword from an original codeword using a hardware error-detecting circuit is provided. The method includes processing by the error-detecting circuit a selection of symbols of the received codeword using a set of factors, the original codeword being recomputable from a corresponding said selection of symbols of the original codeword using the set of factors. The processing includes recomputing remaining symbols of the original codeword by using a hardware multiplier and accumulator on the set of factors and the selection of symbols of the received codeword, comparing by a hardware comparator the recomputed remaining symbols of the original codeword with corresponding said remaining symbols of the received codeword, and outputting first results of this comparison.

The method may further include outputting by the error-detecting circuit the selection of symbols of the received codeword and the recomputed remaining symbols of the original codeword as an error-corrected codeword based on the first results.

The error-detecting circuit may include a plurality of error-detecting circuits, and the processing by the error-detecting circuit of the selection of symbols of the received codeword using the set of factors may include processing by each of the plurality of error-detecting circuits a different said selection of symbols of the received codeword using a different said set of factors.

The method may further include outputting by each of the error-detecting circuits the selection of symbols of the received codeword and the recomputed remaining symbols of the original codeword as an error-corrected codeword based on the first results.

The method may further include outputting by a multiplexor the error-corrected codeword from one of the error-detecting circuits based on the first results from all of the error-detecting circuits.

According to still yet another embodiment of the present invention, a system configured to perform error-correcting code (ECC) detection or correction of a received codeword from an original codeword is provided. The system includes a processor, a non-transitory storage device configured to store computer programming instructions, and a memory. The memory has a set of the instructions stored thereon that, when executed by the processor, causes the processor to process different selections of symbols of the received codeword using corresponding different sets of factors. For each selection of symbols of the different selections of symbols and corresponding set of factors of the different sets of factors, some or all remaining symbols of the original codeword are recomputable from a corresponding said selection of symbols of the original codeword using the set of factors. The processing of the selection of symbols of the received codeword using the set of factors includes recomputing the some or all remaining symbols of the original codeword through multiplication and accumulation using the set of factors and the selection of symbols of the received codeword, and comparing one or more of the recomputed remaining symbols of the original codeword with a corresponding said one or more remaining symbols of the received codeword or the recomputed remaining symbols of the original codeword from the processing of another one of the different selections of symbols of the received codeword. The instructions, when executed by the processor, further causes the processor to output first results of the comparisons.

The instructions, when executed by the processor, may further cause the processor to output at least one of the recomputed remaining symbols of the original codeword as error-corrected symbols of the received codeword based on the first results.

The first results may include complete equality of the compared recomputed remaining symbols of the original codeword.

The symbols of the received codeword may be ordered, and the different selections of symbols of the received codeword may include different consecutive selections of symbols of the received codeword.

A number of the different selections of symbols of the received codeword may equal a number of the symbols of the received codeword.

The different selections of symbols of the received codeword may be ordered by respective first symbols of their corresponding consecutive selections of symbols of the received codeword, and for the processing of the selection of symbols of the received codeword using the set of factors, the processing of the other one of the different selections of symbols of the received codeword includes the processing of a consecutive one of the different selections of symbols of the received codeword.

The recomputing of the some or all remaining symbols of the original codeword through multiplication and accumulation using the set of factors and the selection of symbols of the received codeword may include, for each symbol of the selection of symbols of the received codeword, performing the multiplication of the symbol by each factor in the set of factors in parallel using a pre-built table customized to the set of factors.

According to yet another embodiment of the present invention, a method of hardware error-correcting code (ECC) detection or correction of a received codeword from an original codeword using a plurality of hardware error-detecting circuits is provided. The method includes processing by each of the error-detecting circuits a different selection of symbols of the received codeword using a different set of factors, some or all remaining symbols of the original codeword being recomputable from a corresponding said selection of symbols of the original codeword using the set of factors. The processing includes recomputing the some or all remaining symbols of the original codeword by using a hardware multiplier and accumulator on the set of factors and the selection of symbols of the received codeword, comparing by a hardware comparator one or more of the recomputed remaining symbols of the original codeword with a corresponding said one or more remaining symbols of the received codeword or the recomputed remaining symbols of the original codeword from another one of the error-detecting circuits, and outputting first results of this comparison.

The method may further include outputting by each of the error-detecting circuits at least one of the recomputed remaining symbols of the original codeword as error-corrected symbols of the received codeword based on the first results.

The first results may include complete equality of the compared recomputed remaining symbols of the original codeword.

The symbols of the received codeword may be ordered. The processing by each of the error-detecting circuits may further include processing a different consecutive selection of symbols of the received codeword.

A number of the error-detecting circuits may equal a number of the symbols of the received codeword.

The error-detecting circuits may be ordered by respective first symbols of their corresponding consecutive selections of symbols of the received codeword. For each of the error-detecting circuits, the other one of the error-detecting circuits may be a consecutive one of the error-detecting circuits.

BRIEF DESCRIPTION OF THE DRAWINGS

The accompanying drawings, together with the specification, illustrate example embodiments of the present invention and, together with the description, serve to explain aspects and principles of the present invention.

DETAILED DESCRIPTION

Hereinafter, example embodiments of the present invention will be described in more detail with reference to the accompanying drawings. In the drawings, like reference numerals refer to like elements throughout. Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

The present application relates to Reed-Solomon error correction, described more fully in the Reference application. Briefly, with Reed-Solomon encoding, data words of K symbols are encoded with an additional T symbols (parity symbols or check symbols) to produce codewords of N=K+T symbols. Each of these codewords has the extraordinary property that the entire N symbol codeword is reconstructable from any K of its symbols (i.e., any K symbols of the codeword can be used to generate the remaining T symbols). While the reconstruction property generally requires knowledge of which K symbols are available, Reed-Solomon error correction is directed to the more general problem of reconstructing a codeword when some number (up to T−1) of its symbols have errors, but the location of the errors is unknown.

As described in the Reference Application, this problem can be attacked by brute force, looking for the largest consistent subset of at least K+1 symbols, and then reconstructing the other symbols from this consistent subset. Here, a consistent subset refers to a subset of the N symbols of the codeword for which no errors can be detected. Subsets of K symbols or fewer are consistent by definition since at least K+1 symbols are needed to check for inconsistency.

This brute force approach may be performed by software routines described in the Reference Application, but in general, their complexity grows exponentially with the size of the codeword. Reed-Solomon encoding/decoding involves Galois Field arithmetic. While Galois Field addition is relatively straightforward, Galois Field multiplication is significantly harder. In general, for N symbol codewords with T parity symbols, it takes K Galois field multiplication operations (hereafter referred to as "multiplys") to encode each parity symbol, or a total of K×T multiplys for all T parity symbols. Decoding is of similar complexity.

In an embodiment of the present invention, this process is sped up through the use of a sliding window list decoder, which is a collection of Parallel Error Correctors (PECs). Each PEC is a hardware circuit, as can be realized in, for example, a field programmable gate array (FPGA), that performs the Galois field multiplication and addition operations in parallel for either the encoding or decoding of a particular combination of K symbols of the N symbol codeword, or a separate processing core that performs the multiplication and addition in parallel with other processing cores. For example, in a PEC, for any K symbols of codeword, in one step (clock cycle), the K multiplys can be performed in parallel for each of the T other symbols, and the products added together in parallel in the next clock cycle, thus yielding the T other symbols. During the next clock cycle, the computed T symbols can be compared to the received codeword's corresponding T symbols, noting any differences as indicative of error location or possible correction.

In other embodiments, symbols produced by one PEC may be compared to those of another PEC, producing the same result. A collection of these results (mismatch or match, 1 or 0) may identify all possible errors of length less than T. The location of the error symbols and the length of the error symbols may be identified by the location of the '1' bits in the resultant collection.

For ease of description, it will be assumed throughout that the PECs do not generate errors themselves. Further, in a low latency implementation of an embodiment of the present invention, all of the multiply, addition, and comparison operations could be performed on the same clock cycle, saving both time and resources, since no intermediate registers would be required.

For example, using one of the PECs, the K data symbols in the codeword may be used to generate the T parity symbols. This may be useful, for example, for normal parity symbol generation. It may also be useful for comparing the newly-generated parity symbols to the existing codeword. If there are any discrepancies between the newly generated parity symbols and the existing symbols, then an error has been detected. That is, the codeword is not consistent.

Figure 1:
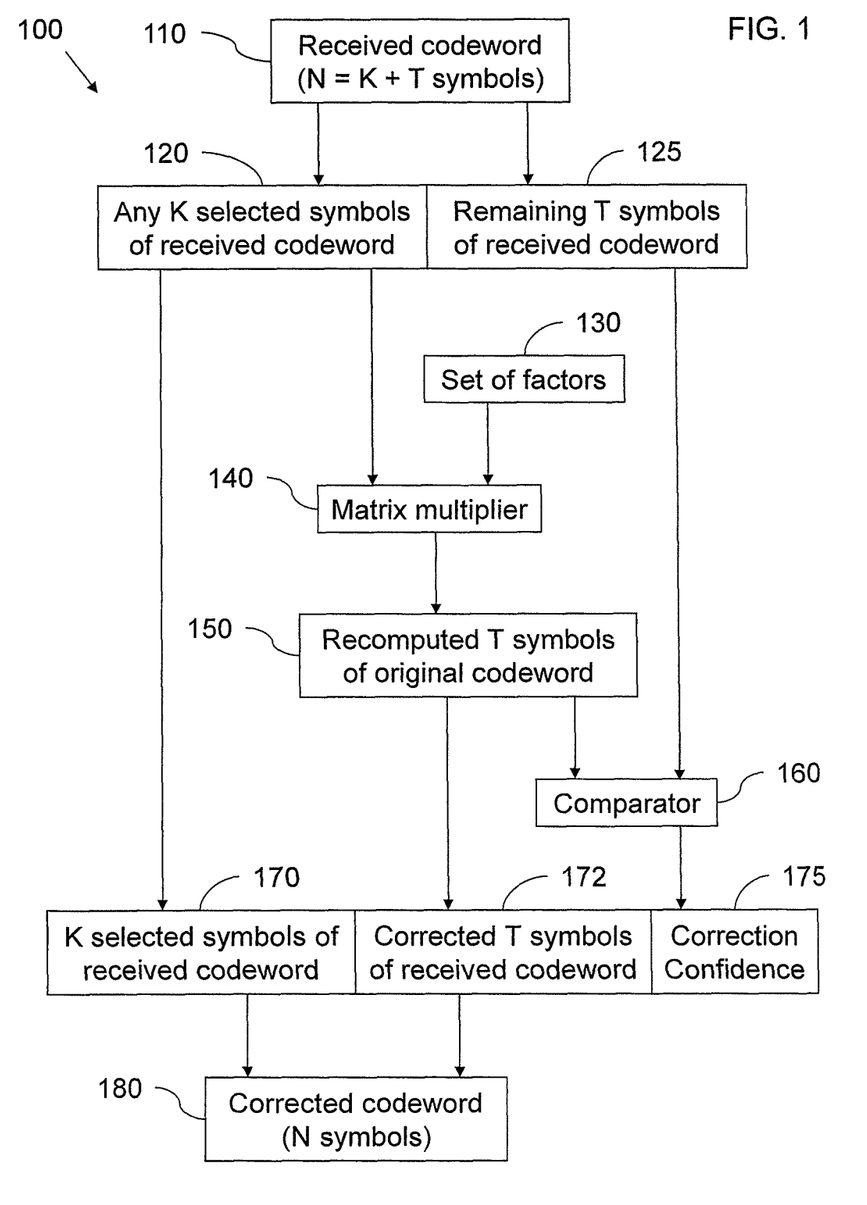
FIG. 1 is a block diagram of an example hardware error detector and corrector according to an embodiment of the present invention.

FIG. 1 is a block diagram of an example hardware error detector and corrector 100 (e.g., a decoder or PEC) according to an embodiment of the present invention. It should be noted that this is one example of a PEC, performing both error detection and correction. Other embodiments of PECs may do only error detection, or may work in conjunction with other PECs to do error detection or correction.

The PEC 100 is illustrated conceptually in FIG. 1 by the different processing steps, many of which are described in more detail below. Processing starts with a received codeword 110 having N=K+T symbols as input to the PEC 100. The received codeword 110 represents an original codeword of N symbols that, for example, has been transferred (such as between computing devices) or stored (such as on a storage media), possibly acquiring errors along the way. The PEC breaks this received codeword 110 into two parts, a selection of K symbols 120 (can be any K symbols) and the remaining T symbols 125. For example, the PEC 100 may be customized to process a particular set of K symbols 120 from a received codeword 110.

The selection of K symbols 120 is paired with a set of factors 130 and input to a matrix multiplier 140. The set of factors 130 corresponds to the selection of K symbols 120 as part of the Reed-Solomon technique. For example, the PEC 100 may be custom designed to select a particular set of K symbols 120 of the received codeword and process these selected K symbols 120 with a corresponding set of factors 130 (which stay fixed for the same selection of K symbols 120 from any N symbol codeword 110 generated with the same Reed-Solomon protocol). The matrix multiplier 140 performs the Galois field multiplication and addition to recompute the remaining T symbols 150 of the original codeword (assuming that there are no errors in the K selected symbols 120).

The recomputed remaining T symbols 150 of the original codeword are then input to a hardware comparator 160, which compares the recomputed remaining T symbols 150 of the original codeword with the remaining T symbols 125 of the received codeword. For example, a symbol-by-symbol comparison may be performed, producing a corresponding bit vector of 1's and 0's (such as an EXCLUSIVE OR comparison, producing 1 if the corresponding two symbols being compared are different and 0 if they are the same). The output of the comparator 160 may also be thought of as an indicator of correction confidence 175. For example, an output of all 0's may be regarded as complete confidence in the error correction, while an output of all 1's may be regarded as complete lack of confidence in the error correction. In other embodiments, counts (such as counts of the number of 0's) or other indicators may be output as the correction confidence 175 instead of or in addition to the bit vectors. The correction confidence 175 is discussed further below.

As part of the correction process, the PEC 100 may take the K selected symbols 170 (e.g., the same K selected symbols 120) and output them with the corrected T symbols of the received codeword 172 (e.g., the same recomputed T symbols 150 of the original codeword) as the corrected codeword 180 (e.g., N symbols) depending on the correction confidence 175. For example, when any errors are contained in the remaining T symbols 125 of the received codeword, the PEC 100 will recompute the correct T symbols 172 of the original codeword as part of its processing. However, depending on the correction confidence 175, the PEC 100 may or may not output this corrected codeword as the corrected codeword 180.

Figure 2:
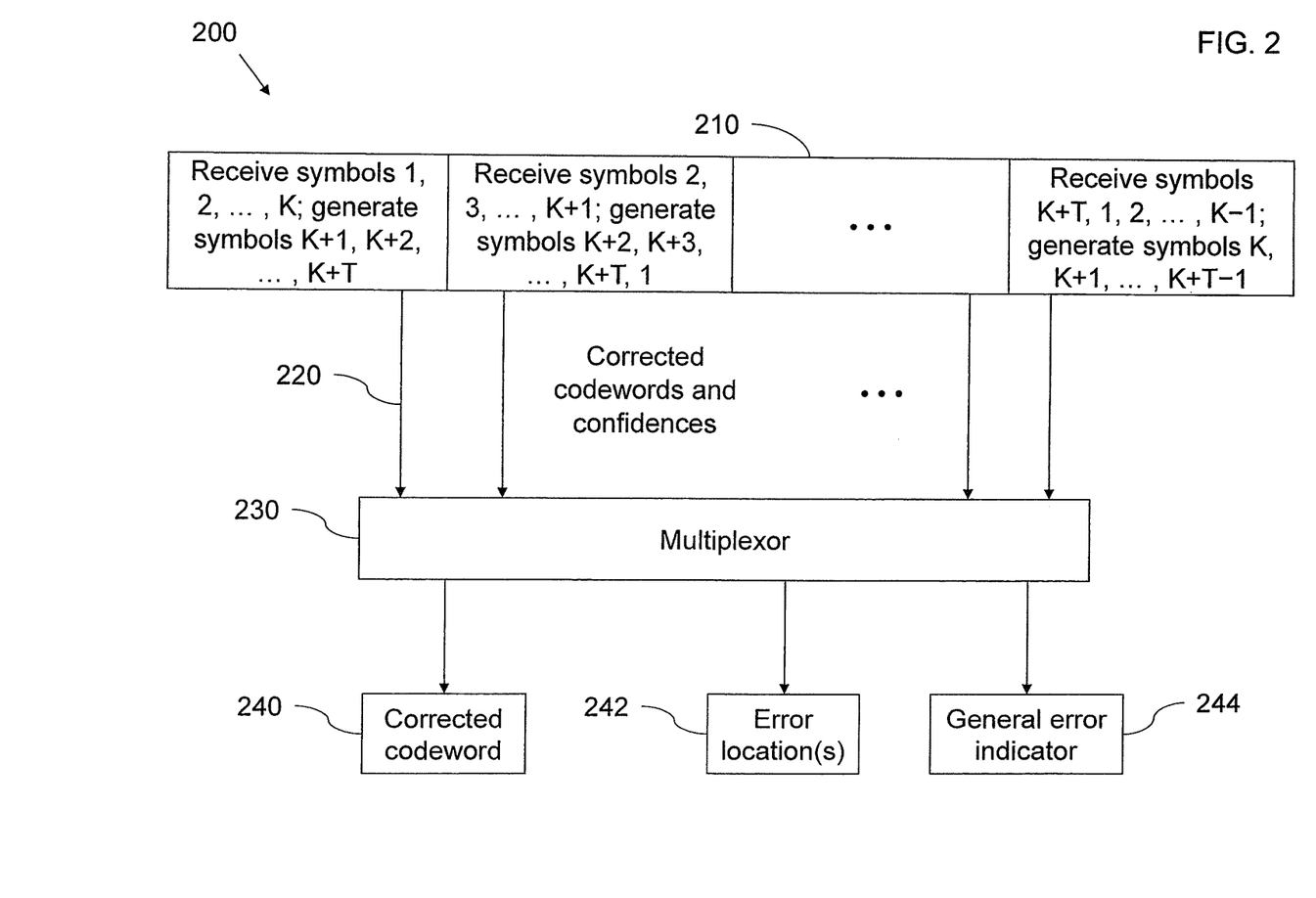
FIG. 2 is a block diagram of an example hardware error detector and corrector according to another embodiment of the present invention.

FIG. 2 is a block diagram of an example hardware error detector and corrector 200 (e.g., a decoder or multi-PEC system) according to another embodiment of the present invention. As with FIG. 1, the decoder 200 in FIG. 2 is illustrated as performing both error detection and correction, but in other embodiments, the decoder may do only error detection.

The decoder 200 includes a plurality of PECs 210 (such as N=K+T such PECs 210). For example, each PEC 210 may be similar to the PEC 100 described in FIG. 1. Here, the N=K+T symbols are numbered 1, 2, . . . , K+T. Each PEC 210 is responsible for receiving a different K consecutive symbols and generating a corresponding remaining T consecutive symbols. For example, the first PEC 210 receives symbols 1, 2, . . . , K, and generates symbols K+1, K+2, . . . , K+T, the second PEC 210 receives symbols 2, 3, . . . , K+1, and generates symbols K+2, K+3, . . . , K+T, 1, and so on, while the last (Nth or (K+T)-th) PEC 210 receives symbols K+T, 1, 2, . . . , K−1, and generates symbols K, K+1, . . . , K+T−1.

The PECs 210, in turn, process their corresponding portions of the received codeword, producing outputs such as corrected codewords (or bit vectors) and correction confidences, such as those described above in reference to FIG. 1. These are input to a multiplexor 230 (or multiplexor logic), which produces the desired outputs from the decoder 200. For example, the decoder 200 may output one or more of a corrected codeword 240 (e.g., as described above in FIG. 1), error locations 242 (such as a bit vector of good and bad input symbols), and a general error indicator 244 (such as when the decoder 200 detects inconsistency in the received codeword but is unable to correct it with sufficient confidence).

For example, the decoder 200 may be a special hardware circuit for detecting any error, but correcting only simple errors (such as single symbol errors). For more involved error scenarios (which may be relatively rare), the decoder 200 may pass control to a more thorough error corrector, such as a brute force software error corrector.

For a given Reed-Solomon encoding, such as for K=20 data symbols and T=10 parity symbols, a fixed K×T=20×10 encoding matrix may be used, performing 200 multiplys concurrently in one clock cycle. Because the factors may be constants for a given encoding matrix, the hardware can be built to take advantage of these fixed values, which significantly simplifies the design. The partial products may then be summed in T=10 groups each of K=20 products concurrently to produce the T=10 parity symbols in another clock cycle. In the third clock cycle, the newly computed (regenerated) parity symbols can be compared to those of the existing codeword to determine if there are any errors detected. In another embodiment, all three steps could be performed in a single, longer clock cycle because of the additional latencies required for each step. In both cases, the correct decoding of Reed Solomon codewords occurs more frequently and at lower latency than traditional serial decoders.

In general, there are four possible comparison results: (1) all the regenerated parity symbols match the codeword parity symbols, in which case the codeword is consistent and no errors are detected, (2) all the regenerated parity symbols mismatch the codeword parity symbols, in which case the codeword is inconsistent and an indeterminate number of errors are detected, (3) at least half (but not all) of the regenerated parity symbols match the codeword parity symbols, and the remaining symbols mismatch the codeword parity symbols, in which case the codeword is inconsistent, but a (single) closest valid codeword is detected, so the errors are correctable, or (4) less than half (but at least one) of the regenerated parity symbols match the codeword parity symbols, in which case there could be closer valid codewords, so more information is needed before making a determination of what to do. Cases (1), (2), and (3) are straightforward (namely, good codeword, bad and uncorrectable codeword, and bad and correctable codeword, respectively), but case (4) is more nuanced.

It should be noted that the case of greater than T errors is not considered in any of these scenarios. Simply stated, once the number of errors exceeds the number of parity symbols T, it becomes impossible with Reed-Solomon codes to discern codewords with large numbers of errors from valid codewords with no errors or few numbers of errors. Likewise, while detecting T errors is possible with T parity symbols, attempting to correct more than T−1 errors is equally impossible to do with any certainty or confidence. Accordingly, any error correcting scenario with Reed-Solomon codes assumes that there are no more than T−1 errors in unknown positions.

Define the confidence C of such a comparison result to be the number of regenerated parity symbols that match the codeword parity symbols. The trivial cases of C=T and C=0 then reduce to cases (1) and (2), respectively, while the correctable case of C≥T/2 is case (3), so assume 0<C<T/2. For 8-bit symbols (e.g., bytes) having 256 possible values, random errors, K=20 data symbols, and T=10 parity symbols, then the larger the value of C, the more certain that the errors are all in the codeword parity symbols.

If any one of the data symbols is corrupted, it will cause a completely different set of parity symbols to be regenerated (that is, not one will match the original parity symbols). This follows from the Galois field multiplication used to generate the parity symbols, as well as the property that valid codewords are either identical or differ in at least T+1 corresponding symbol positions (i.e., have a Hamming distance of at least T+1). Changing one input symbol thus forces the resulting T parity symbols to be completely different than the original parity symbols. Accordingly, the only parity symbols that will match are those that happen to have an error but that are nonetheless consistent with the corrupted data symbols. Intuitively, for uniformly random symbol values (e.g., errors) showing up in the regenerated parity symbols, this is a one in 256 chance per regenerated parity symbol (for one-byte symbols), which works out to less than one in 25 of happening over all 10 parity symbols, less than one in 1437 of happening with two or more parity symbols, and less than one in 142,709 with three or more parity symbols.

With this in mind, in one or more embodiments, the PEC may also perform error correction with C<T/2. Larger values of T (and hence, C) allow more errors to be corrected (a property of Reed-Solomon codes). In this case, if a relatively large value of C is obtained, such as close to T/2 with a suitably large value of T, the likelihood is that all the errors are contained in the codeword symbols that were regenerated, so the PEC can output the K selected symbols from the codeword plus the regenerated T symbols as the corrected N symbol codeword. However, if one of the K selected symbols from the codeword has an error, the overwhelming likelihood is that the confidence C will be 0 or perhaps 1, and highly unlikely to approach T/2. In this case, the PEC may output an indicator of inconsistency (error detection) without any error correction. In another embodiment, the PEC may output a possible corrected codeword for larger values of C (such as 3 when T=10). By comparing T symbols, all errors (such as all burst errors) in these symbols with size smaller than T will be identified with at least one match.

For example, with K=20 and T=10, C=4 may be sufficient confidence from a single PEC to correct the codeword. After all, if there are errors in the selected symbols for the PEC, the odds that the regenerated symbol will match the original symbol is only one in 256 (for one-byte symbols), which for T=10 total symbols, the probability of reaching C=4 (or more) by coincidentally matching four of the original codeword symbols is less than one in 20,839,805.

Figure 3:
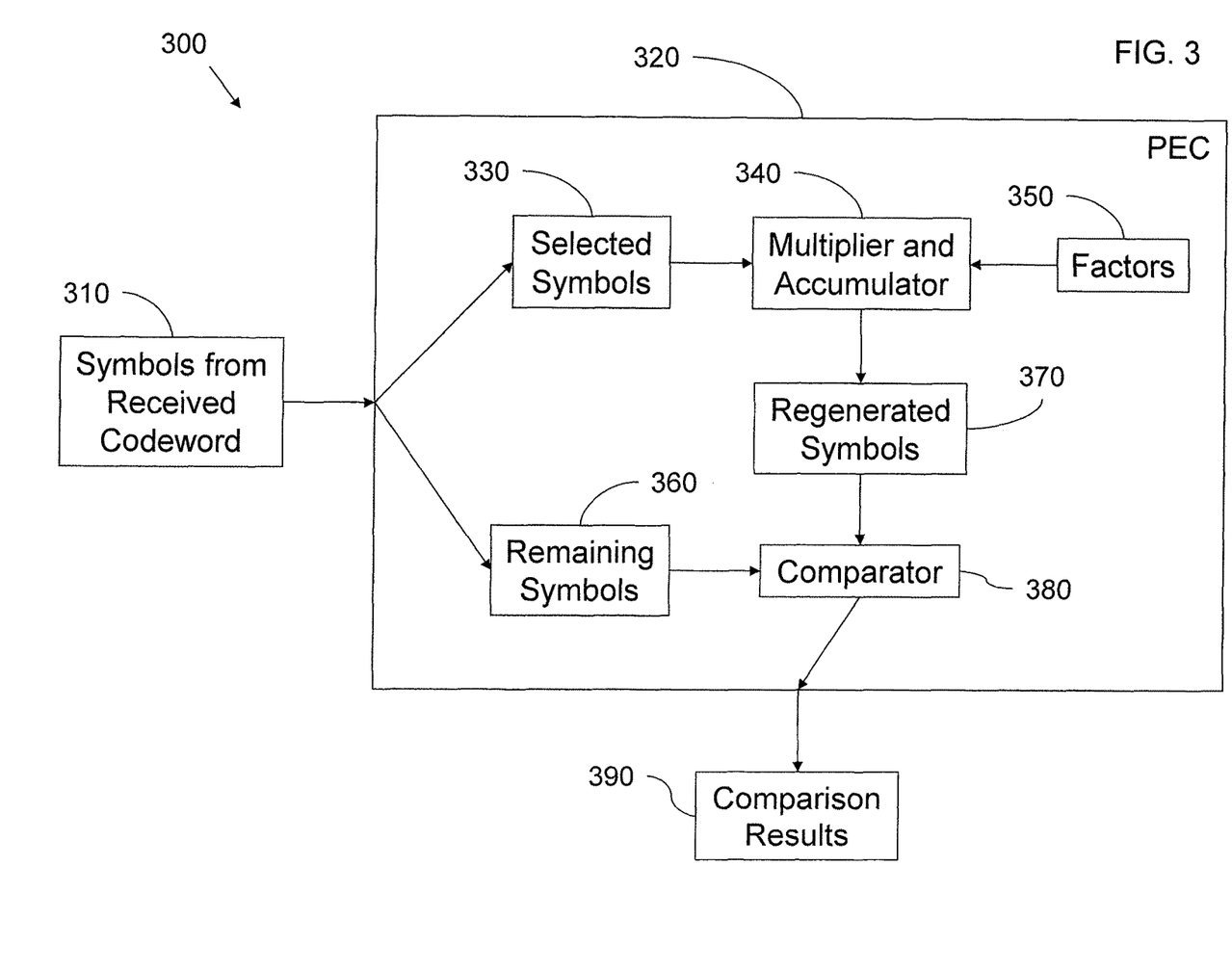
FIG. 3 is a block diagram of an example system for hardware error-correcting code (ECC) detection or correction of a received codeword from an original codeword according to an embodiment of the present invention.

FIG. 3 is a block diagram of an example system 300 for hardware error-correcting code (ECC) detection or correction of a received codeword 310 from an original codeword according to an embodiment of the present invention. The system 300 may be realized, for example, in hardware, such as an FPGA or other custom circuit, using arithmetic logic circuits and memory circuits, as would be apparent to one of ordinary skill.

The system 300 includes an error-detecting circuit (or PEC) 320, which inputs N symbols from a received codeword 310 and outputs comparison results 390. The PEC 320 breaks up the N input symbols 310 into two sets: a set of K selected symbols 330 for use in regenerating the other T (unselected) symbols 370, and a set of T remaining symbols 360 for use in comparing with the T regenerated symbols 370. For simplicity, the codewords are assumed to be a standard length (e.g., N=K+T symbols), with standard symbols and a standard Reed-Solomon encoding matrix. Accordingly, for any fixed set of K selected symbols 330, there exists a unique set of (K×T) factors 350 for regenerating the T unselected symbols 370 from the K selected symbols 330. To this end, the PEC 320 includes a hardware multiplier and accumulator 340 for regenerating the T unselected symbols 370 from the K selected symbols 330 using the factors 350. The PEC 320 further includes a hardware comparator 380 for comparing the T regenerated symbols 370 with the corresponding received remaining symbols 360 and outputting the comparison results 390.

By way of example, the PEC 320 may output (as the comparison results 390) a count of or a T-bit vector identifying which of the T regenerated symbols 370 equal their corresponding received remaining symbols 360. In addition (or instead of), the PEC 320 may output (as the comparison results 390) the regenerated symbols 370, or a combination of the received selected symbols 330 and the regenerated symbols 370 (for example, as a regenerated codeword, such as an error-corrected codeword). For example, depending on the symbol-by-symbol comparison, the PEC 320 may output an error-corrected codeword. It should be noted that in other embodiments, the PEC 320 may generate only a subset of the T unselected symbols as the regenerated symbols 370, comparing them to a corresponding subset of the T received remaining symbols 360, and outputting corresponding comparison results 390 of the compared subsets.

While a single PEC implementation is useful, even more power can be harnessed by running multiple PECs concurrently, each on a different K symbols of the codeword. For example, in some embodiments, the codeword symbols may be ordered or otherwise arranged to enable groups of K symbols to be systematically chosen. In particular, groups may be chosen that have a higher propensity for exhibiting errors, such as consecutive symbols in case of an error burst (several contiguous symbols of noise). For example, the N symbols may be arranged sequentially, and N groups of K consecutive symbols selected, each group starting at a different symbol position and continuing sequentially (with wraparound) for K total symbols. Thus, consecutive groups overlap in K−1 symbols. Each of these groups may then be assigned to a separate PEC, each of which has a custom K×T encoding matrix (used to produce the remaining T symbols). This takes maximal advantage of the Reed-Solomon erasure code property, namely that any K symbols of an N symbol codeword can be used to (re-)generate the remaining T symbols.

There may be other groups of K symbols having this higher propensity to exhibit errors. Accordingly, in different embodiments, different selections of K symbols (such as different systematic selections) may be chosen. For example, consecutive even-numbered or consecutive odd-numbered symbols may be more likely to exhibit error bursts. Consequently, in addition to, or in place of, the sequential selection of K symbols discussed above, selections of consecutive even-numbered symbols or consecutive odd-numbered symbols may be chosen (together with other symbols if needed to reach a total of K symbols). Fewer groups may also be chosen, such as N/2 groups of K consecutive symbols, each group starting at a different even-numbered symbol position.

In addition, in one or more embodiments, a fourth clock cycle (or an additional latency) is added to the multiplication, addition, and comparing cycles described above for a single PEC. In the fourth clock cycle, the outputs of the PECs are compared between themselves, and a selection is made of what information to output. For example, in one embodiment, the most likely error-corrected codeword is output (when possible), while in another embodiment, the most likely error symbols are output (depending, for instance, on what values the follow-on circuitry is expecting). In still another embodiment, a list of possible error-corrected codewords is output, perhaps with confidence levels for each codeword (and perhaps a sorted list by confidence level).

While three basic output conditions are identified above for a single PEC, the outputs of the N PECs described above cover many more cases. In a non-limiting embodiment, assume without loss of generality that after three clock cycles (or three sets of latency), each PEC outputs two pieces of information: the corrected codeword and the confidence value C. There are numerous scenarios of what the group of N PECs may output.

For example, the possibilities include: (a) all PECs output C=T, in which case no errors are detected; (b) all PECs output C=0, in which case an indeterminate number of errors exists, and no error correction is possible; (c) two or more (say P) PECs output a maximum confidence $C=C_{max}$, and all P PECs with confidence $C=C_{max}$ generate the same corrected codeword, in which case the same corrected codeword is output as the most likely correct original codeword, this time with two confidence values, namely first order confidence $C_{max}$ and second order confidence P; (d) only one PEC outputs a maximum confidence $C_{max}$, but $C_{max}$ is sufficiently large (say, $C_{max} \geq T/2$ or almost as large as T/2) that it is certain or overwhelmingly likely that this PEC regenerated the closest valid codeword, which is then output as the corrected codeword with a first order confidence of $C_{max}$ and a nominal second order confidence of 1; and (e) none of the above, such as P>1 but no unanimity of the corrected codeword among these P PECs, or P=1 but $C_{max}$ is not sufficiently large, such as $C_{max}<T/2$ (or not quite as large as T/2), in which case only a general error indication is output.

Cases (a) and (b) are trivial, and similar to the one PEC output cases (1) and (2), respectively. Case (e) is similar to case (b), just being decided by a threshold confidence value versus the trivial no confidence scenario. Case (d) is similar to the single PEC output case (3) described above. Case (c), though, is the more interesting case. The first order confidence value $C_{max}$ is inversely related to the number of corrected symbols F, namely $F=T-C_{max}$. While low values of $C_{max}$ thus indicate a large number of errors, this seemingly low confidence indication is partially offset by the fact that multiple PECs generated the same corrected codeword despite using different encoding matrices. For large first order confidence values $C_{max}$, or large second order confidence values P, this is unlikely to happen unless the error symbols are all located in the symbol positions being regenerated by each of the P PECs.

That is, the greater the value of $C_{max}$ or the greater the value of P, the greater the confidence. First order confidence $C_{max}$, however, provides a greater indication of confidence than second order confidence P since there is a greater likelihood for multiple PECs to generate the same incorrect codeword when $C_{max}$ is low whereas a high value of $C_{max}$ almost always results from correctly finding the closest valid codeword regardless of the value of P. From another viewpoint, $C_{max}=1$ is almost always going to be seen as a low confidence answer regardless of the value of P whereas $C_{max}$ close to T/2 is almost always going to seen as a high confidence answer even if P=1. Accordingly, in some embodiments, $C_{max}=1$ may be treated as a general error indicator while $C_{max}$ close to T/2 (or higher) may be treated as a correct regenerated codeword.

The above set of cases is just an example. In other embodiments, different cases may be used. For example, the requirement of unanimity may be too extreme for large values of F. Accordingly, in some embodiments, case (c) may be replaced with (c'): two or more (say P) PECs output a maximum confidence $C=C_{max}$ (say, at least 2), and a single group (say, of size $P_{max}$ PECs) of these P PECs with confidence $C=C_{max}$ generate the same corrected codeword, in which case the same corrected codeword is output as the most likely correct original codeword, this time with two confidence values, namely first order confidence $C_{max}$ and second order confidence $P_{max}$. Here, the other $P-P_{max}$ PECs likely stumbled on the same (low) confidence $C_{max}$ by chance, but the multiple $P_{max}$ PECs provides sufficient (second order) confidence to believe that this group regenerated the correct original codeword.

Figure 4:
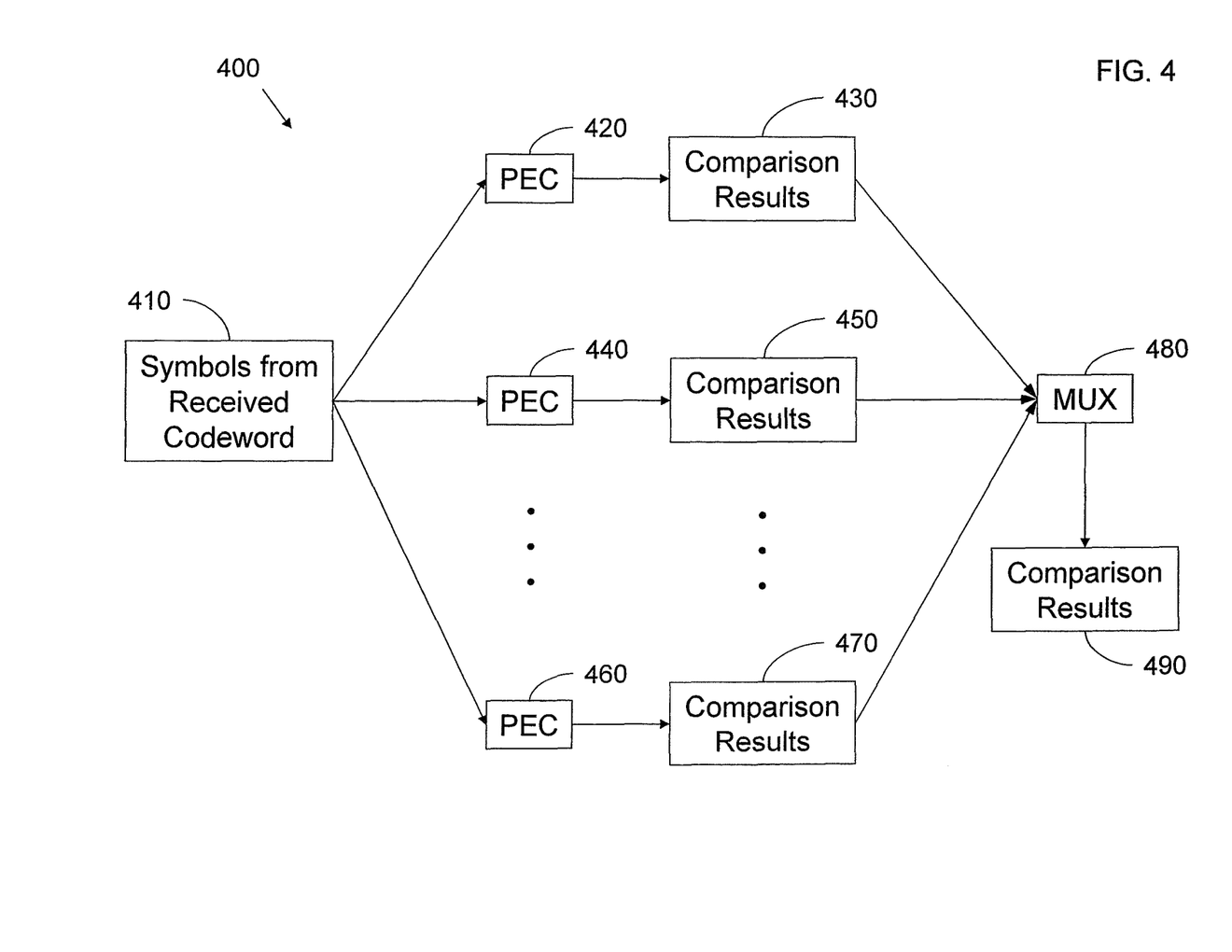
FIG. 4 is a block diagram of an example system for hardware ECC detection or correction of a received codeword from an original codeword according to another embodiment of the present invention.

FIG. 4 is a block diagram of an example system 400 for hardware ECC detection or correction of a received codeword 410 from an original codeword according to another embodiment of the present invention.

The system 400 includes a plurality of PECs 420, 440, . . . , 460, each processing a different selection of K symbols from the N input symbols 410 using a corresponding different set of factors and generating a different set of T remaining or unselected symbols (or subset thereof), and generating potentially different respective comparison results 430, 450, . . . , 470. For example, each of the PECs 420, 440, . . . , 460 may be a separate instance of PEC 320 in FIG. 3.

In addition, the system 400 includes a group comparison circuit 480, such as a multiplexer circuit (MUX), for outputting group comparison results 490. For example, the group comparison circuit 480 may receive the error corrected codeword from each of the PECs 420, 440, . . . , 460, and select the codeword from the PEC having the largest confidence (such as the PEC generating the most number of symbols that match the corresponding received codeword symbols). In another example, if all of the PECs 420, 440, . . . , 460 return small confidence values, the group comparison circuit 480 may return a general error indicator as the group comparison results 490, or a best guess as to the correct codeword, or some other result such as those described above.

Increasing the symbol size (entry size), say from eight bits to 16 (e.g., one byte to two bytes), or increasing the number of parity symbols T, say doubling, significantly reduces the likelihood of deciding among seemingly low confidence alternatives. For instance, 16-bit symbols or entries are highly unlikely to compare equal by chance (e.g., the one in 256 chance discussed above becomes one in 65,536). Likewise, increasing T increases the number of symbols that the PEC can check, which increases the chance that the PEC (and more importantly, multiple PECs) generate the same corrected codeword while also eliminating competition from other low confidence PECs that come up with different corrected codewords.

Another Approach

In the above multi-PEC approach, the comparisons are done in a manner similar to the single PEC approach, namely comparing the results of the regenerated T symbols to the corresponding T symbols of the codeword. Another approach with multiple PECs is to compare the regenerated codewords to the regenerated codewords of other PECs. For example, if the N symbols of the codeword are arranged in a cyclical order (such as 1, 2, . . . , N, and then back to 1 again), then N separate PECs can process regenerating the T consecutive symbols starting at each of the N different symbol positions of the codeword. This creates N separate codewords. The regenerated codewords can then be compared to each other.

As the regenerated codewords from the PECs are assumed to be valid (or consistent) codewords (since the PECs are assumed to not introduce any new errors in their calculations, and generated or regenerated codewords of N symbols from K initial symbols are by definition consistent), the regenerated codewords are either pairwise equal or differ in at least T+1 symbols. This is a property of Reed-Solomon encoding: each parity symbol grows the (Hamming) distance between different consistent codewords by at least one more than the number of parity symbols (T), which is T+1 symbols in this case. However, adjacent PECs (i.e., those pairs of PECs assigned to the K symbols at each of consecutive symbol positions of the codeword) by construction share the same K−1 initial symbols, leaving only a maximum of T+1 symbols by which they can differ. Accordingly, the adjacent PECs either generate the same remaining T+1 symbols or they generate completely symbolwise distinct sets of the remaining T+1 symbols. As such, it suffices to compare only a single symbol of these T+1 symbols between each pair of adjacent PECs.

Accordingly, using this technique, up to T−1 errors are correctable in the T−1 shared parity symbols of the two adjacent PECs. By extension, a burst of up to T−1 errors in any T−1 consecutive symbols of the codeword is correctable by testing for equality in any one of the T+1 nonoverlapping symbols of the corresponding adjacent PECs. It should be noted that the confidence of such a correction (e.g., T−1 errors) may be relatively low, but that can be addressed in other ways, such as using larger symbol sizes, invoking other techniques (such as brute force, Welch-Berlekamp, etc.) in such circumstances, outputting lists of possible regenerated codewords or error locations (possibly with confidence levels as well), examining outputs of other PECs and comparisons between PECs, etc.

Figure 5:
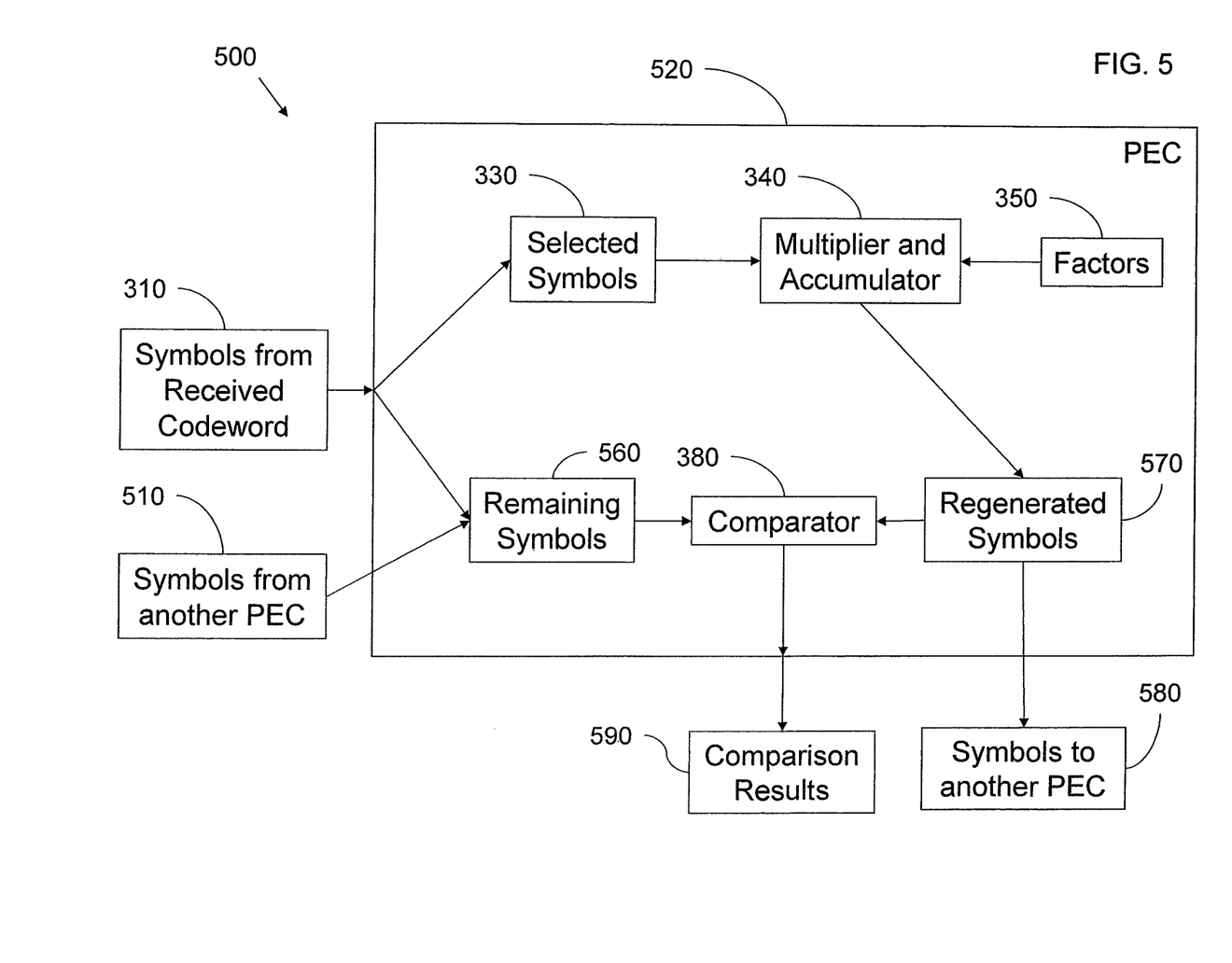
FIG. 5 is a block diagram of an example system for hardware ECC detection or correction of a received codeword from an original codeword according to yet another embodiment of the present invention.

FIG. 5 is a block diagram of an example system 500 for hardware ECC detection or correction of a received codeword 310 from an original codeword according to yet another embodiment of the present invention.

The system 500 of FIG. 5 has similar features and reference numerals to that of FIG. 3, so for briefness of description, discussion will focus primarily on the differences. In FIG. 5, the PEC 520 has a similar organization to the PEC 320 of FIG. 3. The most significant difference is that the PEC 520 receives two different input streams for comparison symbols, namely the N symbols from the received codeword 310, and some number (such as between 1 and T) of regenerated symbols 510 from another PEC, such as an adjacent (or consecutive) PEC. The remaining symbols logic 560 may, for example, decide which symbols to use for comparison, or the selection may be built into the hardware (e.g., choosing one symbol from the received codeword and T−1 symbols from the regenerated symbols 510 from another PEC). In other embodiments, the PEC 520 may receive regenerated symbols 510 from two or more other PECs, such as both adjacent PECs in a consecutive ordering of the PECs.

The comparison results 590 of the PEC 520 may be modified as appropriate from the comparison results 390 of FIG. 3 to account for the differences between the embodiments, such as which symbols take part in the comparisons. In addition, the regenerated symbols 570 in PEC 520 is modified from the regenerated symbols 370 in PEC 320 to also output some or all of the regenerated symbols 570 to another (or more than one) PEC 580.

Figure 6:
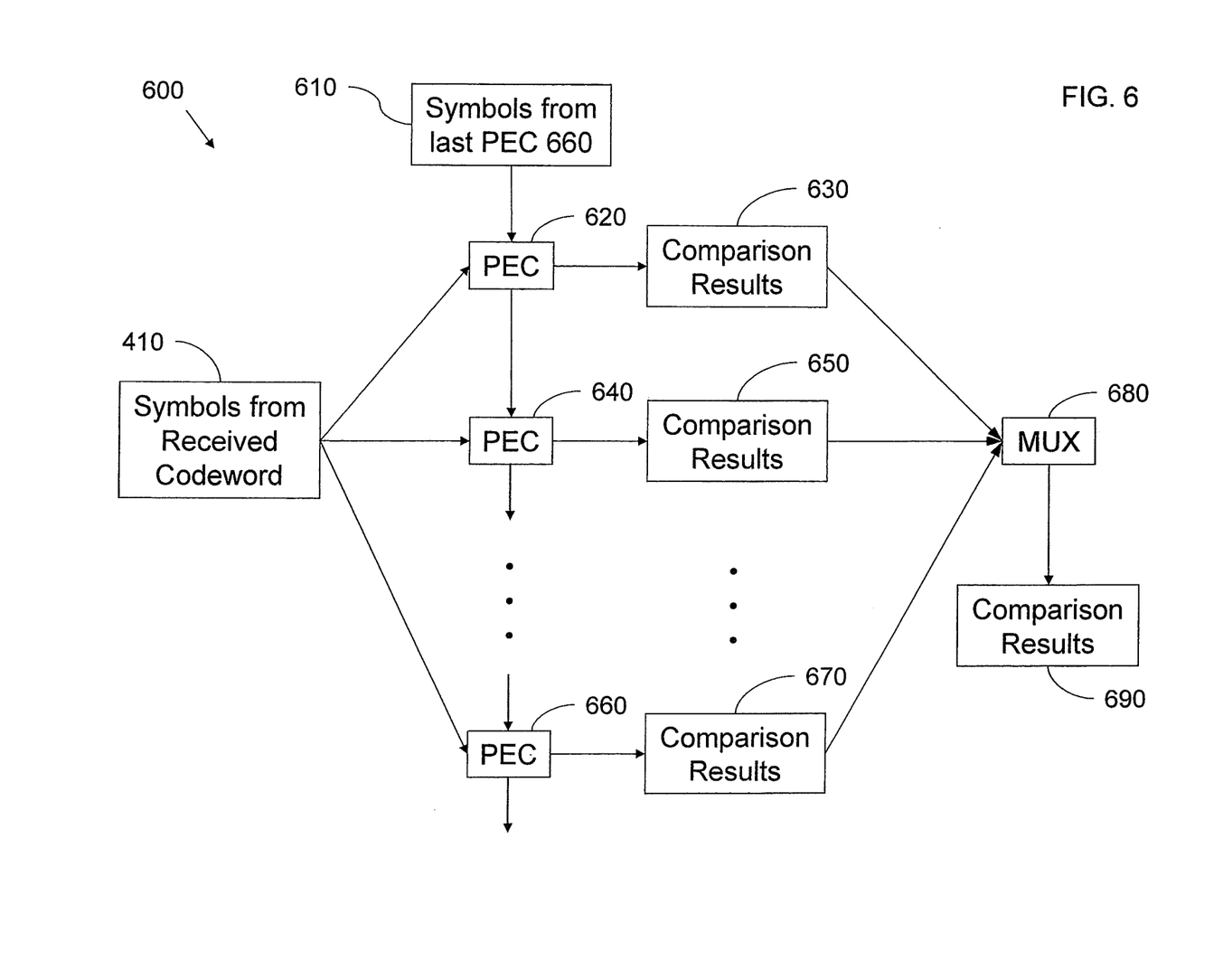
FIG. 6 is a block diagram of an example system for hardware ECC detection or correction of a received codeword from an original codeword according to still yet another embodiment of the present invention.

FIG. 6 is a block diagram of an example system 600 for hardware ECC detection or correction of a received codeword 410 from an original codeword according to still yet another embodiment of the present invention.

The system 600 has similar features to that of FIG. 4, so for briefness of description, discussion will focus primarily on the differences. Each of the PECs 620, 640, . . . , 660 may be a separate instance of PEC 520 in FIG. 5. The PECs 620, 640, . . . , 660 share their regenerated symbols as discussed above in FIG. 5. For example, the first PEC 620 may receive the regenerated symbols 610 from the last PEC 660, and the first PEC 620 may in turn send its regenerated symbols to the second PEC 640. This arrangement may then repeat through all the PECs 620, 640, . . . , 660, so that each PEC receives the regenerated symbols from its immediately preceding PEC.

As a non-limiting example, there may be N PECs altogether, with PEC 620 receiving and processing symbols 1, 2, . . . , K from the received codeword 410, PEC 640 receiving and processing symbols 2, 3, . . . , K+1, and so on, with PEC 660 receiving and processing symbols K+T, 1, 2, . . . , K−1, as described above in reference to FIG. 2. Each PEC may then output the T−1 regenerated symbols it shares in common with its adjacent PEC to which it is sending regenerated symbols (for the adjacent PEC to use in its comparisons with its own regenerated symbols).

The corresponding comparison results 630, 650, . . . , 670 may then contain results of the comparisons with the regenerated symbols of the adjacent PECs (such as bit vectors, corrected codewords, etc.), which may then be output to a group comparison circuit 680 (such as a multiplexer MUX), which may output the final comparison results 690 of the system 600.

Implementation Considerations

While the above description covers some of the theoretical aspects of parallel error correctors for error correcting codes, what follows are some implementation considerations for building such parallel error correctors.

Of the T+1 nonoverlapping codeword symbols in each pair of adjacent PECs, one symbol does not require recomputation in the first PEC and another symbol does not require recomputation in the second PEC. Let $B_1 B_2 \ldots B_N$ be the N symbol supplied codeword (with symbols $B_1, B_2, \ldots, B_N$) being subjected to error correction. Assume PEC $P_1$ provided with initial symbols $B_1 B_2 \ldots B_K$ and PEC $P_2$ provided with initial symbols $B_2 B_3 \ldots B_{K+T}$ are the two adjacent PECs to be tested for error burst correction. Then they overlap in the K−1 initial symbols $B_2 B_3 \ldots B_K$ and they share regenerating the T−1 parity symbols $B_{K+2} B_{K+3} \ldots B_{K+T}$, with PEC $P_1$ further regenerating symbol $B_{K+1}$ and PEC $P_2$ further regenerating symbol $B_1$.

Accordingly, from the discussion above, it suffices to regenerate only a single codeword symbol from each of the PECs. For example, each PEC $P_i$ can regenerate the codeword symbol $B_{i-1}$ to compare with the supplied codeword symbol $B_{i-1}$ and if the two are the same, then, depending on the similar comparisons of the other PECs, an error burst of up to T−1 symbols among the T−1 shared symbols being regenerated by PECs $P_{i-1}$ and $P_i$ is detected and can be corrected. This is equivalent to generating an inconsistency bit string S of N bits, with each bit $S_i$ in the inconsistency string S being 1 if supplied symbol $B_i$ is not consistent with the K succeeding symbols $B_{i+1}, B_{i+2}, \ldots, B_{i+K}$, and being 0 if it is consistent. Each PEC $P_i$ then computes $S_{i-1}$, so the inconsistency string S can be computed in parallel among the N PECs, each bit corresponding to a different reconstruction of the original symbols from the received symbols. Each reconstruction corresponds to a different consecutive K symbols.

The resulting N-bit string of bits S that represents matches (0) and mismatches (1) indicates the location of possible errors (for example, burst errors) of size less than T. For example, a single error (such as in received symbol $B_1$) generates $S_1=1$, $S_2=S_3=\ldots=S_T=0$, and $S_{T+1}=S_{T+2}=\ldots=S_{K+T}=1$ (that is, T−1 consecutive 0's and K+1 consecutive 1's), with burst errors of size T−1 symbols or less being guaranteed to generate at least one 0 bit in the inconsistency string S (since they contain at least one set of K+1 consecutive symbols that are consistent).

In general, if the sliding window successfully corrects a burst error of length L (less than or equal to T−1) and "weight" W (for example, L consecutive symbols, the first and last having errors and a total of W symbols having errors) then there will be T−L+1 consecutive reconstructions that agree and so T−L consecutive 0's in the inconsistency string S. If it is desired to know how long a burst error is, then it is not necessary to reconstruct all T symbols of each reconstruction to compare with the received symbols, the system can just compare 1 symbol for each PEC, as discussed above. The number of symbols in which the reconstruction agrees with the received codeword will be T−W. If the correctly reconstructed symbols are desired, then for each string of 0's in the results (inconsistency string S), the system could recompute all T symbols for any one of the corresponding consecutive reconstructions, and compare to the received symbols.

For reconstructing symbols from a window of size T, it is possible to precompute a set of factors that allows the recomputation of the T symbols from the K received symbols outside the window (e.g., as discussed in the Reference Application). However, in some cases it may be more efficient to instead use a different set of factors that allow the T symbols to be recomputed using the unerased parity symbols (that is, those of the last T symbols of the received codeword that are outside the window), along with the "partial parity" of the unerased data symbols (that is, those of the first K symbols of the received codeword that are outside the window). The partial parity is the result of the encoding matrix applied to the data vector (that is, the first K symbols of the received codeword), but with rows and columns corresponding to symbols inside the window removed. One feature of this method is that when reconstructing different windows but using the same received codeword, the overall parity can first be computed and then just subtract the parity of the window. If T is smaller than K this can lead to improved efficiency.

Other Uses

While the above description covers some of the embodiments of the present invention, aspects of the present invention can be applied to different applications, some of which will be described here.

For example, the above-described ECC decoder may be usefully combined with existing ECC decoders to preserve and then improve the performance of existing systems and standards. One practical implementation would be a software only change to an existing hardware ECC decoder system. For example, before error recovery is abandoned, in one embodiment, a software-based approach of the above techniques could be tried in an attempt to recover the data. Another embodiment could be a hardware combination of the old approach with the new approach, with an intermediate circuit to usefully combine both results.

As an example of such an embodiment, a Berlekamp decoder could be augmented with a sliding window decoder. If the Berlekamp decoder failed to decode (so any error must have weight greater than T/2), then the sliding window decoder could be tried, providing a chance to correct burst errors of weight between T/2 and T−1. In another embodiment, the sliding window decoder could be used to make Berlekamp more conservative. If Berlekamp identifies a codeword within T/2 of the received codeword but the sliding window also sees that it is within T−1 of some other codeword via a burst error, then the combined decoder could declare decoder failure (e.g., decide that the Berlekamp has stumbled upon a silent data corruption of more than T/2 errors but fewer than T, but that is being mistakenly reported as fewer than T/2 errors), or log the fact that this decoding is perhaps suspect.

Another different practical embodiment would be to use a hardware based sliding window decoder first and then use a Berlekamp decoder if the sliding window failed. The low latency of the sliding window approach could speed up error correction on average.

For a software based approach, a processor (such as a microprocessor) configured to execute a set of instructions (such as machine instructions) could be used. The instructions may be stored on a nonvolatile storage device, such as a disk drive or Flash memory. The processor may have a memory for accessing the instructions and input data, and for storing output data. The processor may have one or more processing cores that can perform the processing on different threads in parallel. In general, the above-described hardware approach may be simulated in software as would be apparent to one of ordinary skill.

Conceptually, the software version replaces the multipliers and adders discussed above with the memory and the processor capable of performing Galois Field arithmetic. For example, in place of the multiplication and addition circuits discussed above, corresponding locations in the memory could be used, with the processor performing the multiplication and addition, storing the results in the corresponding locations in the memory, as would be apparent to one of ordinary skill.

By way of example, in one embodiment, this software approach may be performed serially by a single processor. That is, the above-described fully parallelized hardware solution with dedicated hardware (separate multipliers and adders) is replaced with a serial machine with a shared multiplier and adder (the processor) working together with the memory to perform the same Galois Field arithmetic, comparisons, and outputting.

This software solution may be accelerated with a "parallel multiplier." Using the above example of codewords having 30 symbols, namely 20 data symbols and 10 parity symbols, each software "PEC" recomputes 10 missing symbols from 20 received symbols. This involves 200 separate multiplys, namely 10 separate multiplys for each of the 20 received symbols. Each received symbol is thus multiplied by 10 separate factors as part of its share of the 200 multiplys. These multiplications can be carried out in parallel using SSE instructions in a manner similar to that described in the Reference Application, only here, the supplied symbol stays the same, and this symbol is multiplied by a set of 10 factors. Since the 10 factors are known in advance, and are used to process this symbol position in all such codewords, the lookup table can be built in advance to do the 10 separate multiplications in parallel.

Accordingly, all such lookup tables can be pre-built for each of the 20 symbol positions in each of the 30 software "PECs," which will significantly speed up the Galois Field multiplication. Depending on factors such as the symbol size, the data processing size of the processor, and the number of symbols T being regenerated, the processor may be able to perform all of the multiplys for a single symbol position of a single "PEC" in a handful of instructions. By way of example, the Reference Application discusses a method of multiplying 64 byte-sized symbols at a time by a single symbol using the SSE architecture. Here, the technique is similar, only it is the single symbol of the received codeword being multiplied concurrently by the different set of factors needed to regenerate the T missing symbols. For example, with byte-sized symbols, a similar implementation could be used to process values of T up to 64 in the same short parallel multiplier loop.

Figure 7:
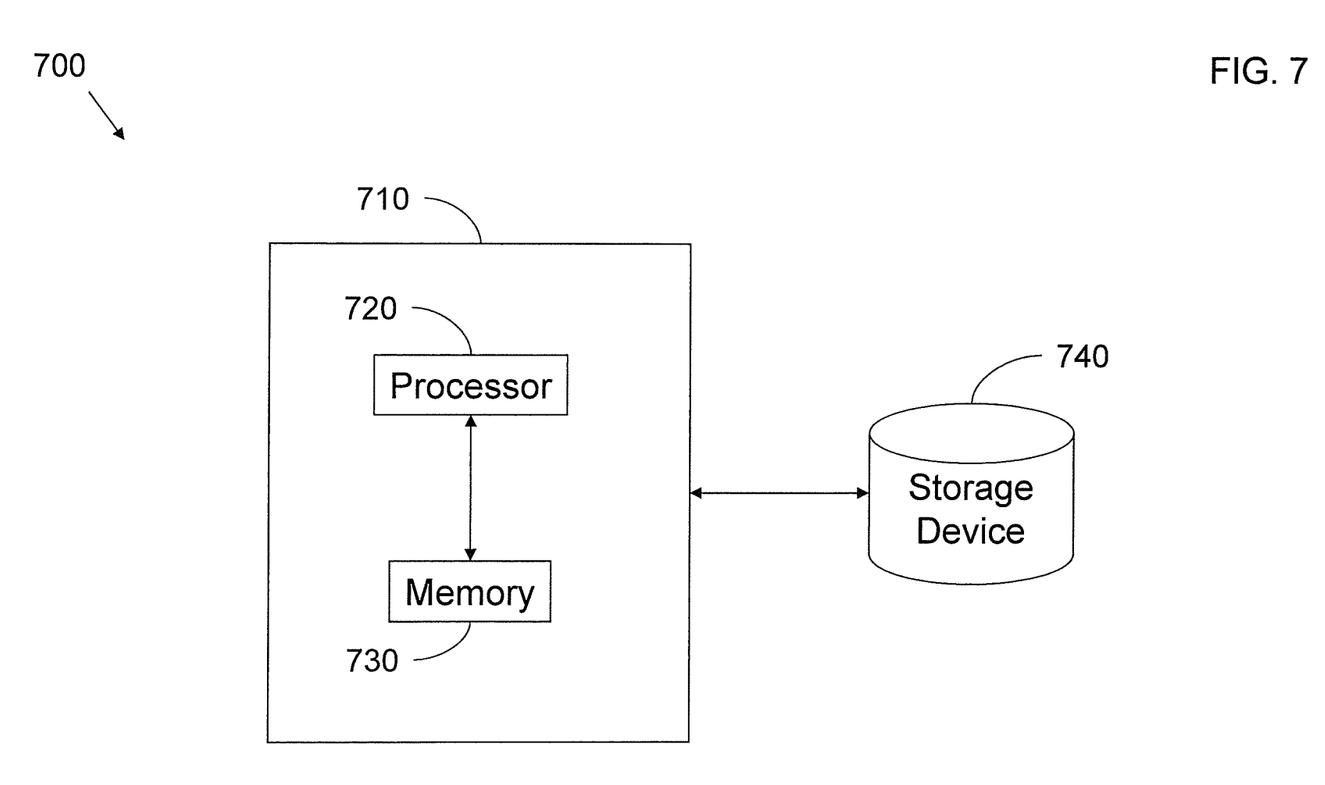
FIG. 7 is a block diagram of an example software-based system for ECC detection or correction of a received codeword from an original codeword according to an embodiment of the present invention.

FIG. 7 is a block diagram of an example software-based system 700 for ECC detection or correction of a received codeword from an original codeword according to an embodiment of the present invention.

The system 700 uses a computer 710 (such as a general purpose computer, personal computer, customized computer, etc.) that includes a processor 720 and memory 730 for carrying out the Reed-Solomon encoding and decoding operations on supplied codewords. The system 700 also includes a non-transitory storage device 740, such as a disk drive, for storing data and program instructions used by the processor 720 to perform this task. For example, the memory 730 may load software instructions from the storage device 740 that, when executed by the processor 720, causes the processor to perform any of the above-described hardware ECC detection or correction implementations. Codewords may be supplied, for example, from the storage device 740 (or supplied over a network, such as a local area network or wide area network). The processor may perform the Reed-Solomon encoding and decoding operations on the supplied codewords and output the results to, for example, the storage device 740 or attached networks.

The software-based system 700 may conceptually process more combinations of selected symbols from the supplied codewords than is practical to implement in hardware. For example, the system 700 may be employed when a codeword has been detected by a hardware-based system (such as one described above) to be corrupted, but whose correction is not possible by the hardware-based system (or at least not with sufficient confidence of the result). To this end, the system 700 may store all of the factors needed to do the Reed-Solomon encoding and decoding operations on the storage device 740, loading those sets of factors (into the memory 730) needed for the particular encoding or decoding to be performed. Further optimizations, such as the parallel multiplier discussed above, may be employed by the processor 720 if, for example, the processor 720 supports the features (e.g., SSE architecture) needed for a particular optimization. In some embodiments, the processor 720 may be customized to perform the Reed-Solomon encoding and decoding operations more efficiently.

The software-based system may be applied to existing or future storage devices, for example RAID systems using a maximum distance separable (MDS) erasure coding scheme, such as Reed-Solomon ECC with at least 2 parity drives. In one embodiment a collection of registers of T bits are associated to non-overlapping windows of T symbols, covering all N symbols. The values of each of the windows are reconstructed, using the symbols outside the window, and then compared to the unused symbols inside the window to create the values of the corresponding register. If the registers are all 1's except one register, which shows all 0's except one 1 then the system declares that the symbol corresponding to that 1 is in error.

If there have been no symbol errors then all values of all registers will show 0 (agreement). If there is exactly one symbol in error then the registers corresponding to all windows not covering the error will show all 1's (one-symbol errors will cause all the reconstructed symbols to be in error because of the structure of MDS codes). The reconstruction corresponding to the window covering the error will be correct, thus will only disagree with the received word at the error. Thus, in the embodiment above, the system will be able to correct all errors of up to one symbol, with no chance of failure.

The software-based embodiment above provides a different level of data protection—not just recovering from a known disk failure, but recovering from silent data corruption that can be added to existing and future data storage systems. By using more windows, thus more registers and more computation, the system could also provide protection against errors larger than one symbol, although perhaps only with a level of certainty, not the absolute guarantee as for one symbol.

The list approach and the resulting bit vector, as described in embodiments above, reveal important information regarding the performance of the storage or data transmission systems, which is not usually exposed using Welch-Berlekamp. This information could be described as error correction "meta-data," and could be used in many useful fashions. For example, in one embodiment, a communication system could increase its transmission rate until the meta-data revealed too much stress, such as decreasing confidence levels as described above. In other embodiments, this type of feedback loop could implement what performance enthusiasts call "over-clocking," but then could auto-adjust to the application environment by using the meta-data. In another embodiment, for a computation involving a very large data set, this meta-data, accumulated over time, could provide a confidence level that the overall computational result was based on trustworthy data.

GLOSSARY OF SOME VARIABLES

C confidence of error correction (number of regenerated symbols=codeword symbols)
F number of corrected symbols
K number of data symbols
N number of codeword symbols=K+T
T number of parity symbols
L length of a burst error
W weight of a burst error
S inconsistency bit vector While the above description contains many specific embodiments of the present invention, these should not be construed as limitations on the scope of the present invention, but rather as examples of specific embodiments thereof. Accordingly, the scope of the present invention should be determined not by the embodiments illustrated, but by the appended claims and their equivalents.

What is claimed is:

1. A system for hardware error-correcting code (ECC) detection or correction of a received codeword from an original codeword, the system comprising:
   an error-detecting circuit configured to process a selection of symbols of the received codeword using a set of factors, the original codeword being recomputable from a corresponding said selection of symbols of the original codeword using the set of factors, the error-detecting circuit comprising:
- a hardware multiplier and accumulator configured to use the set of factors and the selection of symbols of the received codeword to recompute remaining symbols of the original codeword; and
- a hardware comparator configured to compare the recomputed remaining symbols of the original codeword with corresponding said remaining symbols of the received codeword and to output first results of this comparison, wherein the error-detecting circuit comprises a plurality of error-detecting circuits each configured to process a different said selection of symbols of the received codeword using a different said set of factors, wherein the hardware comparator is further configured to compare the recomputed remaining symbols of the original codeword with the remaining symbols of the received codeword by counting a first number of the recomputed remaining symbols of the original codeword that equal respective ones of the remaining symbols of the received codeword, and wherein the first results comprise the first number.

2. The system of claim 1, wherein each of the error-detecting circuits is further configured to output the selection of symbols of the received codeword and the recomputed remaining symbols of the original codeword as an error-corrected codeword based on the first number.

3. The system of claim 2, further comprising a multiplexor configured to output the error-corrected codeword from one of the error-detecting circuits when the first number from the one of the error-detecting circuits is a largest said first number from all of the error-detecting circuits.

4. The system of claim 3, wherein the multiplexor is further configured to output the error-corrected codeword from the one of the error-detecting circuits when the largest first number is at least as large as a first threshold.

5. The system of claim 3, wherein when more than one of the error-detecting circuits has the largest first number, the system is configured to output an error indicator when the error-corrected codeword from each of the more than one of the error-detecting circuits having the largest first number are not equal.

6. The system of claim 4, wherein the first threshold is one-half of a number of the remaining symbols of the received codeword.

7. The system of claim 4, wherein the system is configured to output an error indicator when the largest first number is smaller than the first threshold.

* * * * *